(12) United States Patent
Koyama et al.

(10) Patent No.: US 10,158,012 B1
(45) Date of Patent: Dec. 18, 2018

(54) SEMICONDUCTOR DEVICE

(71) Applicant: Kabushiki Kaisha Toshiba, Minato-ku (JP)

(72) Inventors: Masahiro Koyama, Shinagawa (JP); Kentaro Ikeda, Kawasaki (JP); Kazuto Takao, Tsukuba (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/912,028

(22) Filed: Mar. 5, 2018

(30) Foreign Application Priority Data

Jun. 16, 2017 (JP) .................. 2017-118990

(51) Int. Cl.
| | | |
|---|---|---|
| *H01L 29/16* | (2006.01) | |
| *H01L 29/205* | (2006.01) | |
| *H01L 29/36* | (2006.01) | |
| *H01L 29/778* | (2006.01) | |
| *H01L 29/49* | (2006.01) | |
| *H01L 29/20* | (2006.01) | |

(52) U.S. Cl.
CPC ...... *H01L 29/7787* (2013.01); *H01L 29/1608* (2013.01); *H01L 29/2003* (2013.01); *H01L 29/205* (2013.01); *H01L 29/36* (2013.01); *H01L 29/4966* (2013.01)

(58) Field of Classification Search
CPC ............ H01L 29/1608; H01L 29/7787; H01L 29/2003; H01L 29/205; H01L 29/36; H01L 29/4966
See application file for complete search history.

(56) References Cited

U.S. PATENT DOCUMENTS

| | | | |
|---|---|---|---|
| 8,704,273 B2 | 4/2014 | Okamoto et al. | |
| 8,872,227 B2 | 10/2014 | Umeda et al. | |
| 2003/0080384 A1* | 5/2003 | Takahashi | ............... C30B 25/02 257/347 |
| 2006/0060884 A1* | 3/2006 | Ohyanagi | ......... H01L 29/66416 257/133 |
| 2008/0315257 A1 | 12/2008 | Shiraishi | |

(Continued)

FOREIGN PATENT DOCUMENTS

| | | |
|---|---|---|
| JP | 2002-100773 | 4/2002 |
| JP | 2008-112774 | 5/2008 |

(Continued)

OTHER PUBLICATIONS

Masakazu Kanechika et al. "A Vertical Insulated Gate AlGaN/GaN Heterojunction Field-Effect Transistor", Japanese Journal of Applied Physics, vol. 46, No. 21, 2007, pp. 3

(Continued)

*Primary Examiner* — Jasmine Clark
(74) *Attorney, Agent, or Firm* — Oblon, McClelland, Maier & Neustadt, L.L.P.

(57) ABSTRACT

A semiconductor device includes a first semiconductor layer of silicon carbide, a second semiconductor layer of nitride semiconductor, a third semiconductor layer of nitride semiconductor and a drain electrode. The semiconductor device includes a source electrode that has a first projection portion, a conduction electrode that has a second projection portion and a gate electrode. The first semiconductor layer includes a first region, a second region, a third region and a fourth region.

18 Claims, 5 Drawing Sheets

(56) References Cited

U.S. PATENT DOCUMENTS

2012/0181548 A1* 7/2012 Okada .............. H01L 29/7786
                                                    257/76
2013/0181226 A1   7/2013 Saitoh et al.

FOREIGN PATENT DOCUMENTS

| JP | 5319084 | 10/2013 |
|----|---------|---------|
| JP | 2013-243275 | 12/2013 |
| JP | 5487749 | 5/2014 |
| JP | 5526136 | 6/2014 |
| WO | WO 2012/056770 A1 | 5/2012 |

OTHER PUBLICATIONS

Hui Nie et al. "1.5-kV and 2.2-mΩ-cm2 Vertical GaN Transistors on Bulk-GaN Substrates", IEEE Electron Device Letters, vol. 35, No. 9, Sep. 2014, pp. 3.

Takashi Shinohe, "SiC Power Devices" Toshiba Review, vol. 59 No. 2, 2004, pp. 13 (with Machine Generated English Translation).

* cited by examiner

SEMICONDUCTOR DEVICE

CROSS-REFERENCE TO RELATED APPLICATIONS

This application is based upon and claims the benefit of priority from Japanese Patent Application No. 2017-118990, filed on Jun. 16, 2017, and the entire contents of which are incorporated herein by reference.

FIELD

The embodiment of the present invention relates to a semiconductor device.

BACKGROUND

A power semiconductor device is used for a switching circuit and an inverter circuit for power control.

Although the power semiconductor device is required to have a high breakdown voltage and a high carrier mobility, the breakdown voltage and the carrier mobility of the power semiconductor device using silicon has reached the limit based on physical characteristics of Si.

In recent years, silicon carbide and nitride semiconductors, which have wider bandgap than Si, are expected to be used widely as materials of the power semiconductor device.

A vertical type semiconductor device using silicon carbide has a high breakdown voltage, but a carrier mobility thereof is lower than that of the semiconductor device using Si.

On the other hand, a lateral type semiconductor device having a heterojunction interface using a nitride semiconductor has a high carrier mobility exceeding that of Si, but there is a problem in that it is difficult to allow the lateral type semiconductor device to have a high breakdown voltage. Therefore, a power semiconductor device having both a high breakdown voltage and a high carrier mobility is desired.

DETAILED DESCRIPTION

Hereinafter, embodiments of the present invention will be described with reference to the drawings. The same components are denoted by the same reference numerals. In addition, the drawings are schematic or conceptual, and a relationship between the thickness and the width of each portion, a ratio coefficient of the size between portions, and the like are not necessarily the same as the actual ones. In addition, even in the case of representing the same portions, the dimensions and the ratio coefficients of the portions may be different from each other depending on the drawing.

In this specification, in order to indicate positional relationships of parts and the like, the upward direction of the drawings is described as "upper" and the downward direction of the drawings is described as "lower". In this specification, the concepts of "upper" and "lower" are not necessarily terms indicating the relationship with the direction of gravity.

In this specification, a "GaN-based semiconductor" is a generic name of gallium nitride (GaN), aluminum nitride (AlN), indium nitride (InN), and semiconductors having an intermediate composition thereof.

First Embodiment

Figure 1:
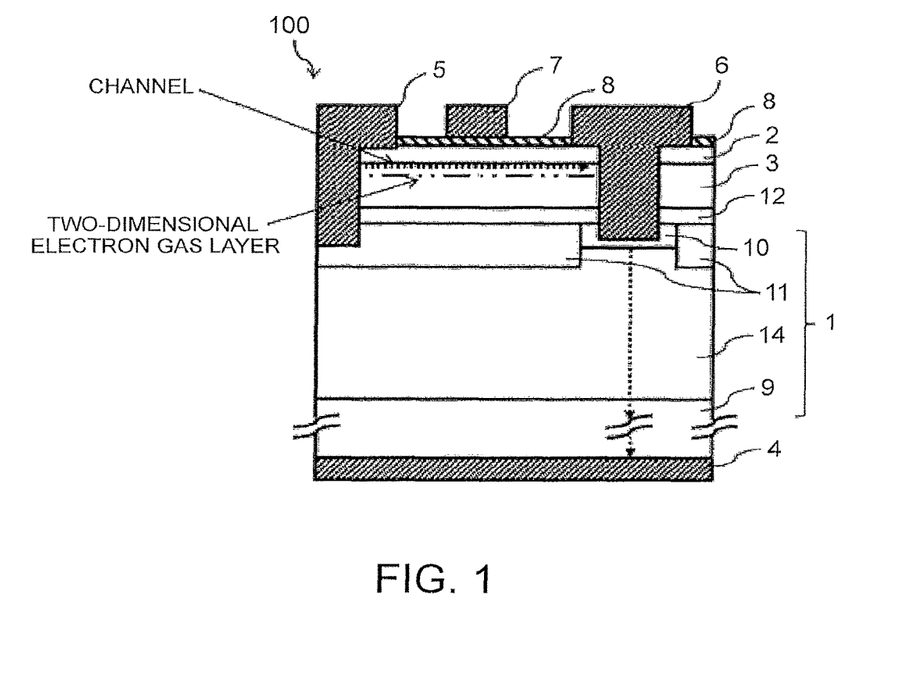
FIG. 1 is a schematic cross-sectional view of a semiconductor device according to a first embodiment.

FIG. 1 is a schematic sectional view of a semiconductor device 100. The semiconductor device 100 is a field effect transistor (FET) made of a GaN-based semiconductor formed on silicon carbide (SiC).

The semiconductor device 100 is a vertical type GaN-based FET in which a GaN-based semiconductor is formed on SiC. In an AlGaN/GaN heterointerface above the SiC, a channel through which carriers flow is formed. This channel electrically conducts with the SiC through a conduction electrode provided in the semiconductor device 100. The SiC becomes a drift layer, and thus, carriers move between the channel of the AlGaN/GaN heterointerface and the SiC drift layer. The semiconductor device 100 achieves a high breakdown voltage by the SiC and realizes a high carrier mobility by the GaN-based semiconductor FET on the SiC.

The semiconductor device 100 includes a first semiconductor layer 1, a second semiconductor layer 2, a third semiconductor layer 3, a drain electrode 4, a source electrode 5, a conduction electrode 6, a gate electrode 7, a first insulating layer 8, and a buffer layer 12. The first semiconductor layer 1 includes a first region 14, a second region 9, a third region 10, and a fourth region 11.

The first semiconductor layer 1 is, for example, silicon carbide (SiC). The thickness of the first semiconductor layer 1 is, for example, 1 μm or more and 100 μm or less. The first semiconductor layer 1 includes the first region 14, the second region 9, the third region 10, and the fourth region 11.

The second semiconductor layer 2 is a nitride semiconductor. The second semiconductor layer 2 is, for example, aluminum gallium nitride ($Al_xGa_{(1-x)}N$, $0<x\leq1$). Hereinafter, the aluminum gallium nitride is denoted by AlGaN. The thickness of the second semiconductor layer 2 is, for example, 1 nm or more and 100 nm or less.

The third semiconductor layer 3 is in contact with the second semiconductor layer 2. The third semiconductor layer 3 is located between the first semiconductor layer 1 and the second semiconductor layer 2. The third semiconductor layer 3 is, for example, gallium nitride (GaN). The third semiconductor layer 3 is preferably i-GaN which is not intentionally doped with impurities. For example, the i-GaN has an impurity concentration of $10^{17}$ $cm^{-3}$ or less. The thickness of the third semiconductor layer 3 is desirably, for example, 100 nm or more and 10 μm or less.

The second semiconductor layer 2 is a material having a bandgap wider than that of the third semiconductor layer 3.

Since the first semiconductor layer 1 is the SiC and is a material different from the GaN of the third semiconductor layer 3, the buffer layer 12 is provided between the first semiconductor layer 1 and the third semiconductor layer 3. The buffer layer 12 is a layer for reducing distortion caused by a difference between a lattice constant of the nitride semiconductor layer formed on the buffer layer 12 and a lattice constant of the SiC. The material of the buffer layer 12 include at least aluminum nitride (AlN) or aluminum gallium nitride (AlGaN). The thickness of the buffer layer 12 is 1 nm or more and 1 μm or less. In order to grow the GaN with low crystal dislocation on the SiC, the thickness of the buffer layer is preferably 10 nm or more and 100 nm or less.

The drain electrode 4 is provided in the first semiconductor layer 1 on the side opposite to the side of the first semiconductor layer 1 which is in contact with the third semiconductor layer 3. The drain electrode 4 is, for example, a metal electrode. The metal electrode includes an element selected from, for example, nickel (Ni), titanium (Ti), and aluminum (Al).

The source electrode 5 is provided on the second semiconductor layer 2 on the side opposite to the side of the second semiconductor layer 2 which is in contact with the third semiconductor layer 3. The source electrode 5 has a projection portion. The projection portion of the source electrode 5 penetrates the first semiconductor layer 1 and the second semiconductor layer 2, and the tip of the projection portion is located inside the third semiconductor layer 3. The source electrode 5 is, for example, a metal electrode. The metal electrode includes an element selected from, for example, nickel (Ni), titanium (Ti), aluminum (Al), and gold (Au).

The conduction electrode 6 is provided on the second semiconductor layer 2 on the side opposite to the side of the second semiconductor layer 2 which is in contact with the third semiconductor layer 3. The conduction electrode 6 has a projection portion. The projection portion of the conduction electrode 6 penetrates through the second semiconductor layer 2, the third semiconductor layer 3, and the buffer layer 12. The tip of the projection portion of the conduction electrode 6 is located inside the first semiconductor layer 1. The conduction electrode 6 is, for example, a metal electrode. The metal electrode includes an element selected from, for example, nickel (Ni), titanium (Ti), aluminum (Al), and gold (Au).

The first gate electrode 7 is located between the source electrode 5 and the conduction electrode 6 in the direction from the source electrode 5 to the conduction electrode 6. The first gate electrode 7 is provided on the side opposite to the side of the second semiconductor layer 2 which is in contact with the third semiconductor layer 3 in the stacking direction. The first gate electrode 7 is, for example, a metal electrode. The first gate electrode 7 may be a material including an element selected from, for example, nickel (Ni), titanium (Ti), aluminum (Al), and gold (Au). Alternatively, the first gate electrode 7 may be a polycrystalline semiconductor material doped with impurities, for example, may be silicon, silicon carbide, or gallium nitride. The first gate electrode 7 may be, for example, TiN.

The source electrode 5, the conduction electrode 6 and the first gate electrode 7 are provided on a first side (first plane) of the second semiconductor layer 2 respectively. The drain electrode 4 is provided on a second side (second plane) of the first semiconductor layer 1.

The first insulating layer 8 is provided between the second semiconductor layer 2 and the first gate electrode 7. The first insulating layer 8 is, for example, silicon oxide, silicon nitride, silicon oxynitride, gallium oxide, aluminum oxide, aluminum oxynitride, hafnium oxide, zirconium oxide, magnesium oxide, or the like. Also, nitride and oxynitride of hafnium, zirconium or magnesium may be used.

The first region 14 of the first semiconductor layer 1 has a first conductivity type. The first conductivity type is, for example, n type with a low doping concentration. The conductivity type of the first region 14 has an impurity concentration of, for example, $10^{15}$ cm$^{-3}$ or more and $10^{17}$ cm$^{-3}$ or less.

The second region 9 is provided in the first semiconductor layer 1 in the vicinity of the interface where the first semiconductor layer 1 and the drain electrode 4 are in contact with each other. The second region 9 has a first conductivity type. The first conductivity type is, for example, n type with a high doping concentration. The second region 9 has an impurity concentration of $10^{18}$ cm$^{-3}$ or more and $10^{20}$ cm$^{-3}$ or less. The thickness of the second region 9 in the direction from the first semiconductor layer to the drain electrode 4 is, for example, 10 μm or more and 1 mm or less.

The third region 10 is provided around the projection portion of the conduction electrode 6. The third region 10 has a first conductivity type. The first conductivity type of the third region 10 is, for example, n type with a high doping concentration. The third region 10 has an impurity concentration of $10^{18}$ cm$^{-3}$ or more and $10^{20}$ cm$^{-3}$ or less. The thickness of the third region 10 in the direction from the first semiconductor layer to the drain electrode 4 is, for example, 10 nm or more and 1 μm or less.

The fourth region 11 is provided in the first semiconductor layer 1 on the side where the third semiconductor layer 3 exists in the direction from the first semiconductor layer 1 to the third semiconductor layer 3. The fourth region 11 is provided between the source electrode 5 and the conduction electrode 6 in the direction from the source electrode 5 to the conduction electrode 6. The fourth region 11 is provided around the projection portion of the source electrode 5. The fourth region 11 has a second conductivity type. The second conductivity type of the fourth region 11 is, for example, p type. The fourth region 11 has an impurity concentration of $10^{15}$ cm$^{-3}$ or more and $10^{20}$ cm$^{-3}$ or less. The thickness of the fourth region 11 is, for example, 1 μm or more and 2 μm or less in the direction from the first semiconductor layer 1 to the third semiconductor layer 3. The thickness of the fourth region 11 is larger than that of the third region 10. By providing the fourth region 11, a depletion layer is formed between the fourth region 11 and the first region 14. The depletion layer extends in the direction from the fourth region 11 to the first region 14, so that the breakdown voltage of the semiconductor device 100 is maintained. For example, the first semiconductor layer 1 has a crystal orientation of the (0001) plane (Si plane) on the side where the second semiconductor layer 2 exists. The crystal orientation may not be perpendicular to the (0001) direction and may have an off angle. For example, the crystal orientation has an off angle of 4°.

In the vicinity of the interface between the second semiconductor layer 2 and the third semiconductor layer 3, a two-dimensional electron gas layer is formed in the third semiconductor layer 3. A two-dotted dash line in FIG. 1 indicates the position where the two-dimensional electron gas layer exists.

A channel through which electrons flow is formed in an arrow direction indicated by a dotted line in FIG. 1. The electrons flow in the direction from the source electrode 5 to the conduction electrode 6. In addition, the electrons flow in the direction from the conduction electrode 6 to the drain electrode 4 through the first semiconductor layer 1. Since the first semiconductor layer 1 which is the SiC has a high breakdown voltage, a large portion of the voltage applied to the semiconductor device 100 is applied to the first semiconductor layer 1 between the conduction electrode 6 and the drain electrode 4.

The semiconductor device 100 is a normally-on device. A negative voltage is applied to the gate electrode 7 in order to stop the electrons from flowing in the channel and turn off the semiconductor device 100. That is, when a negative voltage is applied to the gate electrode 7, the band structure of the interface between the second semiconductor layer 2 and the third semiconductor layer 3 is raised, and the two-dimensional electron gas layer is depleted. Therefore, it is possible to stop the electrons from flowing in the channel of the third semiconductor layer 3.

The voltage applied to the gate electrode 7 allowing electrons in the two-dimensional electron gas layer to flow is determined by a work function of a metal constituting the gate electrode 7, a dielectric constant of the first insulating layer 8, a thickness of the first insulating layer 8, concentrations of donors and acceptors contained in the third semiconductor layer 3, and a surface potential of the third semiconductor layer 3.

According to the embodiment, a semiconductor device that is compatible with a high breakdown voltage and a high carrier mobility is obtained.

As described above, in the semiconductor device 100 according to this embodiment, a channel is formed between the source electrode 5 and the conduction electrode 6 at the AlGaN/GaN heterointerface above the SiC substrate. Electrons flow from the source electrode 5 to the conduction electrode 6, and the electrons further flow from the conduction electrode 6 to the drain electrode 4 through the first semiconductor layer 1 which is the SiC. In the semiconductor device 100, a high breakdown voltage is realized by the first semiconductor layer 1 which is the SiC, and a high carrier mobility is realized by the GaN-based semiconductor FET on the first semiconductor layer 1. Hereinafter, a method of manufacturing the semiconductor device 100 will be described.

First, a preparation process of the second region 9 which is the SiC is performed. Next, an epitaxial growth layer forming process is performed. In this process, a SiC layer which is the first region 14 is formed on the (0001) plane of the second region 9 by epitaxial growth. Next, an ion implantation process is performed. In this process, p type impurities are implanted into the SiC layer, and thus, the fourth region 11 is formed. The p type impurities to be ion-implanted are, for example, aluminum (Al) or boron (B). Next, n type impurities are implanted into the SiC layer, and thus, the third region 10 having a high doping concentration is formed. The n type impurities to be ion-implanted are, for example, phosphorus (P) or nitrogen (N). Next, an impurity activation annealing process is performed. By heating the first semiconductor layer 1 at a high temperature, desired carriers are generated in the impurity region.

Next, a process of forming the buffer layer 12 made of aluminum nitride (AlN) or aluminum gallium nitride (AlGaN) is performed on the first semiconductor layer 1. The buffer layer 12 is formed, for example, by sputtering. Next, an epitaxial growth process of the third semiconductor layer 3 and the second semiconductor layer 2, which are nitride semiconductors, is performed on the buffer layer 12. Next, a process of forming the insulating layer 8 is performed. Then, a process of forming the gate electrode 7 is performed. Next, a process of forming a projection portion for burying the source electrode 5 and the conduction electrode 6 in the nitride semiconductor layer is performed. The process is performed by, for example, reactive ion etching. Next, a process of forming the source electrode 5 and the conduction electrode 6 is performed. Furthermore, in the stacking direction, the drain electrode 4 is formed on the side opposite to the side of the first semiconductor layer 1 where the buffer layer 12 exists by, for example, sputtering.

Second Embodiment

Figure 2:
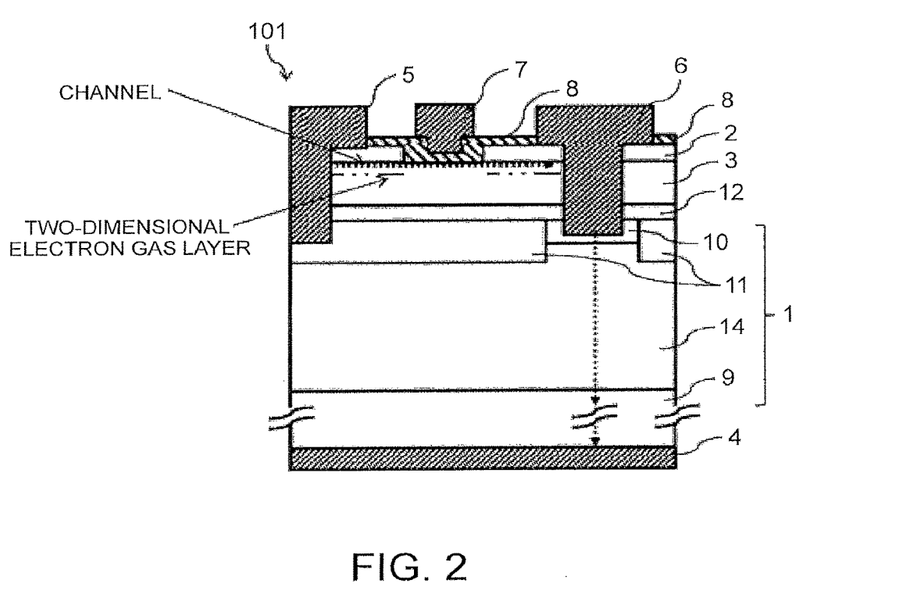
FIG. 2 is a schematic cross-sectional view of a semiconductor device according to a second embodiment.

FIG. 2 illustrates a semiconductor device 101.

The same components as those of the semiconductor device 100 in FIG. 1 are denoted by the same reference numerals, and description thereof is omitted.

The gate electrode 7 has a projection portion. The projection portion of the gate electrode 7 is located inside the second semiconductor layer 2, and the projection portion reaches the third semiconductor layer 3.

Between the projection portion of the gate electrode and the third semiconductor layer 3, the second semiconductor layer 2 is not exist or may exist as long as the thickness is such that a two-dimensional electron gas layer is not induced. For this reason, a two-dimensional electron gas layer does not exist in the third semiconductor layer 3 that is located at the position of the gate electrode 7. Therefore, in the state where no voltage is applied to the gate electrode 7, no electron flows in the channel. Accordingly, the semiconductor device 101 is a normally-off device.

In the vicinity of the interface between the second semiconductor layer 2 and the third semiconductor layer 3, there is a two-dimensional electron gas layer in the third semiconductor layer 3 excluding the position where the gate electrode 7 exists. A two-dotted dash line in FIG. 2 indicates the position where the two-dimensional electron gas layer exists.

Since the third semiconductor layer 3 is an i-GaN which is not intentionally doped with impurities, the third semiconductor layer 3 exhibits n type conduction with a low impurity concentration. In a case where a positive voltage is applied to the gate electrode 7, the third semiconductor layer 3 on the gate electrode 7 side is in an accumulation state where electrons are induced. Therefore, the electrons induced in the accumulation state are connected to the two-dimensional electron gas layer existing at the interface between the second semiconductor layer 2 and the third semiconductor layer 3. Therefore, the electrons flow in the arrow direction indicated by a dotted line in FIG. 2. Accordingly, the semiconductor device 101 operates as an FET.

In the semiconductor device 101, since the projection portion of the gate electrode 7 is buried in the second semiconductor layer 2, the concentration of electrons in the two-dimensional electron gas layer included in the semiconductor layer 3 at the position of the gate electrode 7 decreases as compared with the semiconductor device 100 of FIG. 1. For this reason, the threshold voltage shifts to the positive direction. Therefore, the semiconductor device 101 performs a normally-off operation that has a positive threshold voltage. Accordingly, the semiconductor device 101 is a normally-off device realizing a high breakdown voltage by the first semiconductor layer 1 which is the SiC and a high carrier mobility by the GaN-based semiconductor FET on the first semiconductor layer 1.

Third Embodiment

Figure 3:
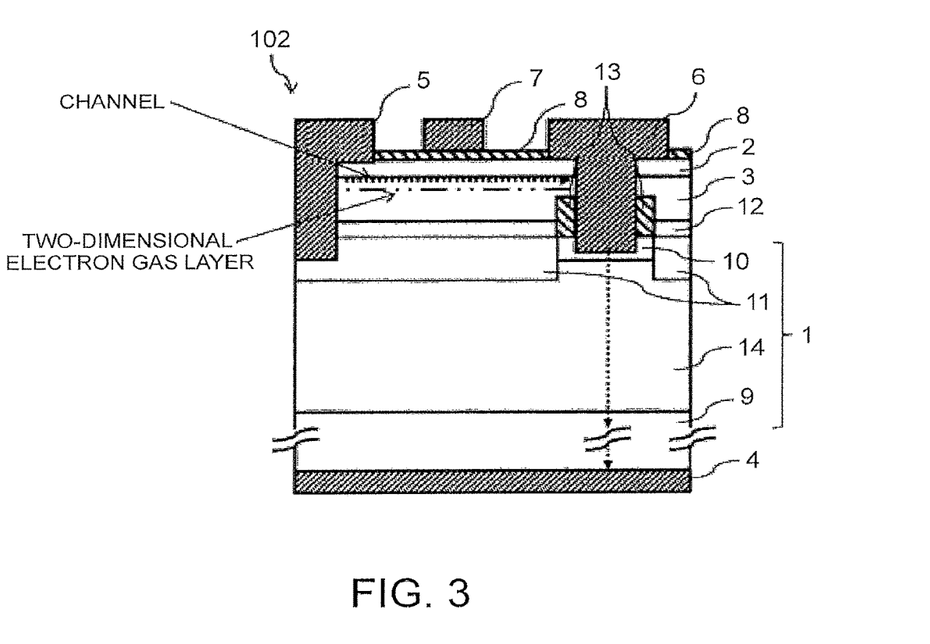
FIG. 3 is a schematic cross-sectional view of a semiconductor device according to a third embodiment.

FIG. 3 illustrates a semiconductor device 102.

The same components as those of the semiconductor device 100 in FIG. 1 are denoted by the same reference numerals, and description thereof is omitted.

The semiconductor device 102 further includes a second insulating layer 13 between the projection portion of the conduction electrode 6 and the third semiconductor layer 3 and between the projection portion of the conduction electrode 6 and the buffer layer 12.

The second insulating layer 13 is made of, for example, silicon oxide, silicon nitride, silicon oxynitride, gallium oxide, aluminum oxide, aluminum oxynitride, hafnium oxide, zirconium oxide, magnesium oxide, or the like. Also, nitride and oxynitride of hafnium, zirconium or magnesium may be used.

By providing the second insulating layer 13 between the conduction electrode 6 and the third semiconductor layer 3 and between the conduction electrode 6 and the buffer layer 12, it is possible to prevent the conduction electrode 6 from electrically conducting with a portion other than the portion of the third semiconductor layer 3 which is to be a channel, and further, it is possible to prevent the conduction electrode 6 from electrically conducting with the buffer layer 12. Therefore, the conduction electrode 6 electrically conducts only with the channel portion of the third semiconductor layer 3.

Alternatively, instead of the second insulating layer 13 described above, there is a method of manufacturing an insulating region by implanting ions into the third semiconductor layer 3 and the buffer layer 12 in the vicinity of the conduction electrode 6. The elements used for ion implantation are, for example, argon (Ar) and fluorine (F). By implanting ions into the third semiconductor layer 3 and the buffer layer 12 in the vicinity of the conduction electrode 6, the third semiconductor layer 3 and the buffer layer 12 in the vicinity of the conduction electrode 6 can be allowed to have an insulating property. The third semiconductor layer 3 and the buffer layer 12 in the vicinity of the conduction electrode 6, which are ion-implanted to have an insulating property, can be used as the second insulating layer 13.

Accordingly, the conduction electrode 6 is prevented from electrically conducting with a portion other than the portion of the third semiconductor layer 3 that becomes a channel, and further, the conduction electrode 6 is prevented from electrically conducting with the buffer layer 12. Therefore, it is possible to prevent the carriers passing through the conduction electrode 6 from leaking into the buffer layer 12 and a portion of the third semiconductor layer 3 that is not channel. Accordingly, in the semiconductor device 102, the leakage of carriers from the conduction electrode 6 is suppressed, and thus, a high breakdown voltage by the first semiconductor layer 1 which is the SiC and a high carrier mobility by the GaN-based semiconductor FET are realized.

Even if the second insulating layer 13 is used for the semiconductor device 101 according to the second embodiment, the leakage of carriers of the conduction electrode 6 can be prevented.

Fourth Embodiment

Figure 4A:
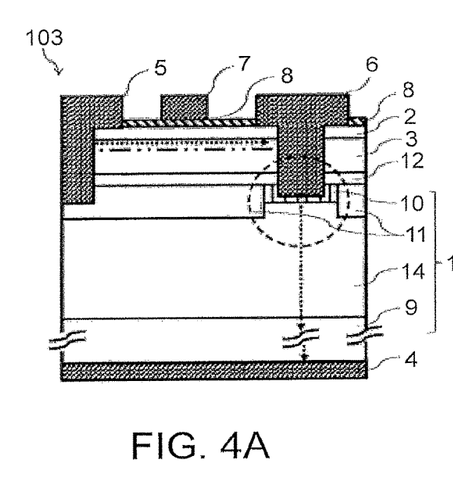
FIGS. 4A and 4B are schematic cross-sectional views of a semiconductor device according to a fourth embodiment.
Figure 4B:
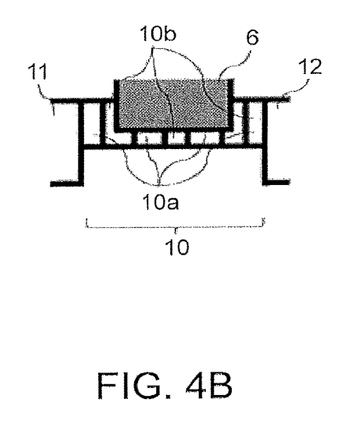

FIG. 4A illustrates a semiconductor device 103, and FIG. 4B illustrates an enlarged view of a portion enclosed by a dotted line in FIG. 4A.

The same components as those of the semiconductor device 100 in FIG. 1 are denoted by the same reference numerals, and description thereof is omitted.

In the third region 10 of FIG. 4B, the fifth region 10a having a first conductivity type and the sixth region 10b having a second conductivity type are alternately located in the direction (lateral direction) from the source electrode 5 to the conduction electrode 6.

In the direction from the source electrode 5 to the conduction electrode 6, the length of the fifth region 10a is, for example, 10 nm or more and 1 μm or less, and the length of the sixth region 10b is, for example, 10 nm or more and 1 μm or less.

The first conductivity type of the fifth region 10a is, for example, n type doped with a high concentration. The second conductivity type of the sixth region 10b is, for example, p type.

The interface between the n type first region 14 having a low doping concentration and the p type sixth region 10b has a pn junction. In a case where no voltage is applied to the gate electrode 7, a depletion layer exists in the pn junction at the interface between the first region 14 and the sixth region 10b. Therefore, depletion layers between the first region 14 and the sixth regions 10b are connected to each other, and a depletion layer exists in the first region 14 around the third region 10.

In a case where no voltage is applied to the gate electrode 7, electric field concentration tends to occur at the tip of the projection portion of the conduction electrode 6, that is, the projection portion of the conduction electrode 6 surrounded by the third region 10. Herein, since the depletion layer exists in the first region 14 around the third region 10, the load of electric field concentration is distributed over the entire depletion layer, so that it is possible to prevent the crystal of the first semiconductor layer 1 from being destroyed. Therefore, the semiconductor device 103 can improve the breakdown voltage of the first semiconductor layer 1, and thus, a high breakdown voltage of the first semiconductor layer 1 which is the SiC and a high carrier mobility by the GaN-based semiconductor FET are realized.

In addition, it is possible to improve the breakdown voltage of the first semiconductor layer 1 by using the third region 10 of this embodiment for the semiconductor devices 101 and 102 in the second and third embodiments.

Fifth Embodiment

Figure 5A:
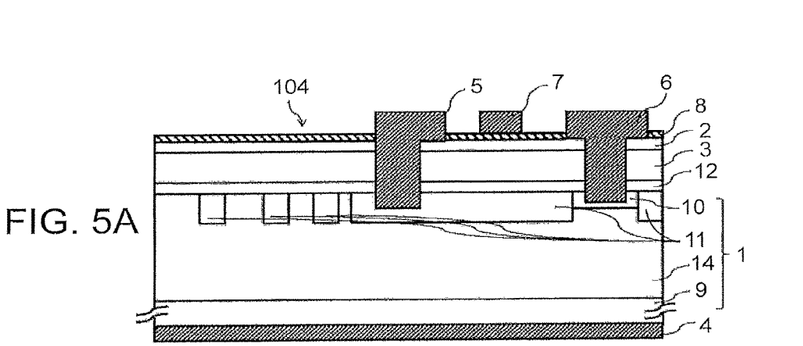
FIGS. 5A and 5B are schematic cross-sectional views of a semiconductor device according to a fifth embodiment.
Figure 5B:
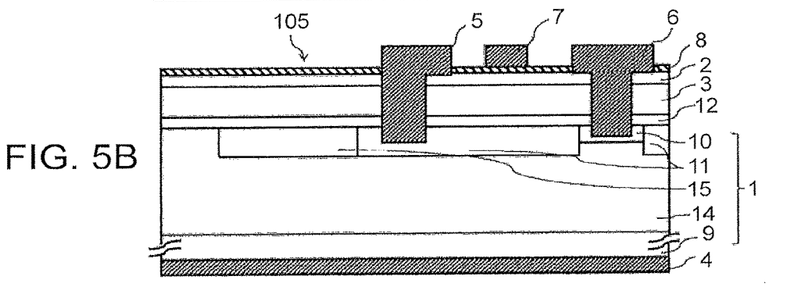

FIG. 5A illustrates a semiconductor device 104 and FIG. 5B illustrates a semiconductor device 105.

The same components as those of the semiconductor device 100 in FIG. 1 are denoted by the same reference numerals, and description thereof is omitted.

The semiconductor device 104 of FIG. 5A includes a plurality of the fourth regions 11 separated from each other in the first semiconductor layer 1.

The fourth regions 11 are located on the side opposite to the side of the first semiconductor layer 1 where the second region 9 exists. The fourth regions 11 are located on the side opposite to the side where the conduction electrode 6 exists as viewed from the source electrode 5. The first semiconductor layer 1 on the side opposite to the side where the conduction electrode 6 exists as viewed from the source electrode 5, becomes a terminated end portion of the semiconductor device 104. A plurality of the fourth regions 11 are separated from each other with the first region 14 interposed therebetween. The fourth regions 11 are formed by implanting ions into the first semiconductor layer 1. The thickness of the fourth regions 11 in the direction from the first semiconductor layer 1 to the drain electrode 4 is, for example, 1 μm or more and 2 μm or less. The fourth regions are guard ring layers. At a position close to the source electrode 5, a plurality of the fourth regions 11 exist at narrow intervals. At a position away from the source electrode 5, a plurality of the fourth regions 11 exist at wide intervals. Besides, as described before, the fourth regions 11 of this embodiment are the second conductivity type, that is, p type. The fourth regions 11 have an impurity concentration of $10^{15}$ cm$^{-3}$ or more and $10^{20}$ cm$^{-3}$ or less.

A plurality of the fourth regions 11 are located not only on the side of the first semiconductor layer 1 where the third semiconductor layer 3 exists but also at the terminated end portion of the semiconductor device 104. Therefore, it is possible to extend the depletion layer in the direction from the conduction electrode 6 to the source electrode 5, on the side opposite to the side of the first semiconductor layer 1 where the drain electrode 4 exists. Thus, it is possible to prevent an electric field from being concentrated on the terminated end portion of the semiconductor device 104. In addition, a current of the source electrode and a current of the channel are prevented from leaking into the first semiconductor layer 1 and other devices.

The semiconductor device 105 of FIG. 5B includes a seventh region 15 which is p type with a low impurity concentration, adjacent to the fourth region 11.

The seventh region 15 is on the side opposite to the side of the first semiconductor layer 1 where the drain electrode 4 exists. The seventh region 15 is located on the side opposite to the side where the conduction electrode 6 exists as viewed from the source electrode 5. In the first semiconductor layer 1, the seventh region 15 is located adjacent to the fourth region 11. The seventh region 15 contains impurities having a second conductivity type having a concentration lower than that of the fourth region 11. The second conductivity type is, for example, p type. The seventh region 15 is a reduced surface field (RESURF) layer.

The seventh region 15 is located adjacent to the fourth region 11, so that it is possible to extend the depletion layer in the direction from the conduction electrode 6 to the source electrode 5, on the side opposite to the side of the n type first region 14 where the drain electrode 4 exists. Therefore, it is possible to prevent an electric field from being concentrated on the terminated end portion of the semiconductor device 105. Accordingly, it is possible to improve the breakdown voltage of the first semiconductor layer 1.

Even when the fourth regions 11 and the seventh region 15 are provided in the above-described semiconductor devices 100 to 103, the same effect can be obtained.

While several embodiments of the present invention have been described, these embodiments have been provided by way of examples and are not intended to limit the scope of the invention. These embodiments can be implemented in various other forms, and various omissions, substitutions, and changes can be made without departing from the spirit of the invention. These embodiments and modifications thereof are included in the invention described in the claims and equivalents thereof as well as being included in the scope and spirit of the description.

What is claimed is:

1. A semiconductor device comprising:
   a first semiconductor layer of silicon carbide;
   a second semiconductor layer of nitride semiconductor;
   a third semiconductor layer of nitride semiconductor provided between the first semiconductor layer and the second semiconductor layer and contacting with the second semiconductor layer;
   a drain electrode provided on a side opposite to a side of the first semiconductor layer where the third semiconductor layer exists;
   a source electrode provided on a first side opposite to a side of the second semiconductor layer where the third semiconductor layer exists and having a first projection portion, the first projection portion penetrating the second semiconductor layer and the third semiconductor layer, a tip portion of the first projection portion being located inside the first semiconductor layer;
   a conduction electrode provided on the first side of the second semiconductor layer and having a second projection portion, the second projection portion penetrating the second semiconductor layer and the third semiconductor layer, a tip portion of the second projection portion being located inside the first semiconductor layer;
   a gate electrode provided on the first side of the second semiconductor layer and is provided between the source electrode and the conduction electrode; and
   a first insulating layer provided between the gate electrode and the second semiconductor layer,
   wherein the first semiconductor layer including,
   a first region of a first conductivity type,
   a second region of the first conductivity type provided between the first region and the drain electrode,
   a third region of the first conductivity type provided between the second projection portion of the conduction electrode and the first region, and
   a fourth region of a second conductivity type provided between the third semiconductor layer and the first region, and between the source electrode and the conduction electrode.

2. The semiconductor device according to claim 1, wherein the gate electrode further has a third projection portion, and the third projection portion of the gate electrode is located inside the second semiconductor layer.

3. The semiconductor device according to claim 1, further comprising a second insulating layer provided between the second projection portion of the conduction electrode and the third semiconductor layer.

4. The semiconductor device according to claim 1, wherein the third region further includes a fifth region and a sixth region, and the fifth region and the sixth region are alternately located in a direction from the source electrode to the conduction electrode.

5. The semiconductor device according to claim 1, wherein a plurality of the fourth regions exist in the first semiconductor layer on a side opposite to a side where the conduction electrodes exist with the source electrode interposed therebetween, and a plurality of fourth regions are separated from each other.

6. The semiconductor device according to claim 1, further comprising a seventh region being adjacent to the fourth region in the first semiconductor layer on a side opposite to a side where the conduction electrodes exist with the source electrode interposed therebetween.

7. The semiconductor device according to claim 1, wherein the second semiconductor layer is Al$_x$Ga$_{(1-x)}$N ($0<x\leq1$).

8. The semiconductor device according to claim 1, wherein the third semiconductor layer is GaN.

9. The semiconductor device according to claim 1, wherein the second semiconductor layer has a bandgap wider than that of the third semiconductor layer.

10. The semiconductor device according to claim 1, wherein the first region is n type.

11. The semiconductor device according to claim 1, wherein the second region and the third region are n type with a concentration higher than that of the first region.

12. The semiconductor device according to claim 1, wherein the fourth region is p type.

13. The semiconductor device according to claim 1, wherein an impurity concentration of the first region is $10^{15}$ cm$^{-3}$ or more and $10^{17}$ cm$^{-3}$ or less.

14. The semiconductor device according to claim 1, wherein an impurity concentration of the second region is $10^{18}$ cm$^{-3}$ or more and $10^{20}$ cm$^{-3}$ or less.

15. The semiconductor device according to claim 1, wherein an impurity concentration of the third region is $10^{18}$ cm$^{-3}$ or more and $10^{20}$ cm$^{-3}$ or less.

16. The semiconductor device according to claim 1, wherein an impurity concentration of the fourth region is $10^{15}$ cm$^{-3}$ or more and $10^{20}$ cm$^{-3}$ or less.

17. The semiconductor device according to claim 1, wherein the conduction electrode includes an element selected from Ni, Ti, Al, and Au.

18. The semiconductor device according to claim 1, wherein the gate electrode is TiN.

* * * * *